(12) United States Patent
Doyle

(10) Patent No.: US 7,170,148 B2
(45) Date of Patent: Jan. 30, 2007

(54) SEMI-FUSIBLE LINK SYSTEM FOR A MULTI-LAYER INTEGRATED CIRCUIT AND METHOD OF MAKING SAME

(75) Inventor: Denis J. Doyle, Patrickswell (IE)

(73) Assignee: Analog Devices, Inc., Norwood, MA (US)

( * ) Notice: Subject to any disclaimer, the term of this patent is extended or adjusted under 35 U.S.C. 154(b) by 31 days.

(21) Appl. No.: 10/777,337

(22) Filed: Feb. 12, 2004

(65) Prior Publication Data

US 2005/0001241 A1    Jan. 6, 2005

Related U.S. Application Data

(60) Provisional application No. 60/484,369, filed on Jul. 2, 2003.

(51) Int. Cl.
*H01L 23/58* (2006.01)
*H01L 23/62* (2006.01)
*H01L 29/00* (2006.01)
*H01L 27/10* (2006.01)
*H01L 29/73* (2006.01)

(52) U.S. Cl. ............... 257/665; 257/209; 257/529; 257/758

(58) Field of Classification Search ............. 257/529, 257/665, 758
See application file for complete search history.

(56) References Cited

U.S. PATENT DOCUMENTS

| | | | | |
|---|---|---|---|---|
| 6,246,243 | B1* | 6/2001 | Audy | 324/550 |
| 6,265,778 | B1* | 7/2001 | Tottori | 257/758 |
| 6,780,711 | B2* | 8/2004 | Johnson et al. | 438/257 |
| 7,050,349 | B2* | 5/2006 | Tanizaki | 365/225.7 |
| 2003/0013280 | A1* | 1/2003 | Yamanaka | 438/487 |
| 2003/0020149 | A1* | 1/2003 | Ogura et al. | 257/678 |
| 2004/0031004 | A1* | 2/2004 | Yoshioka | 716/7 |
| 2004/0094840 | A1* | 5/2004 | Sakamoto et al. | 257/758 |
| 2004/0201098 | A1* | 10/2004 | Corrigan | 257/758 |
| 2005/0156275 | A1* | 7/2005 | Hsieh | 257/529 |
| 2006/0141679 | A1* | 6/2006 | Subramanian et al. | 438/131 |

* cited by examiner

*Primary Examiner*—Ida M. Soward
(74) *Attorney, Agent, or Firm*—Landiorio & Teska

(57) ABSTRACT

A semi-fusible link system and method for a multi-layer integrated circuit including active circuitry on a first layer having a metal one layer including a semi-fusible link element on a second layer having a metal two layer adapted for interconnecting with the metal one layer, and a selector circuit disposed on the first layer.

30 Claims, 7 Drawing Sheets

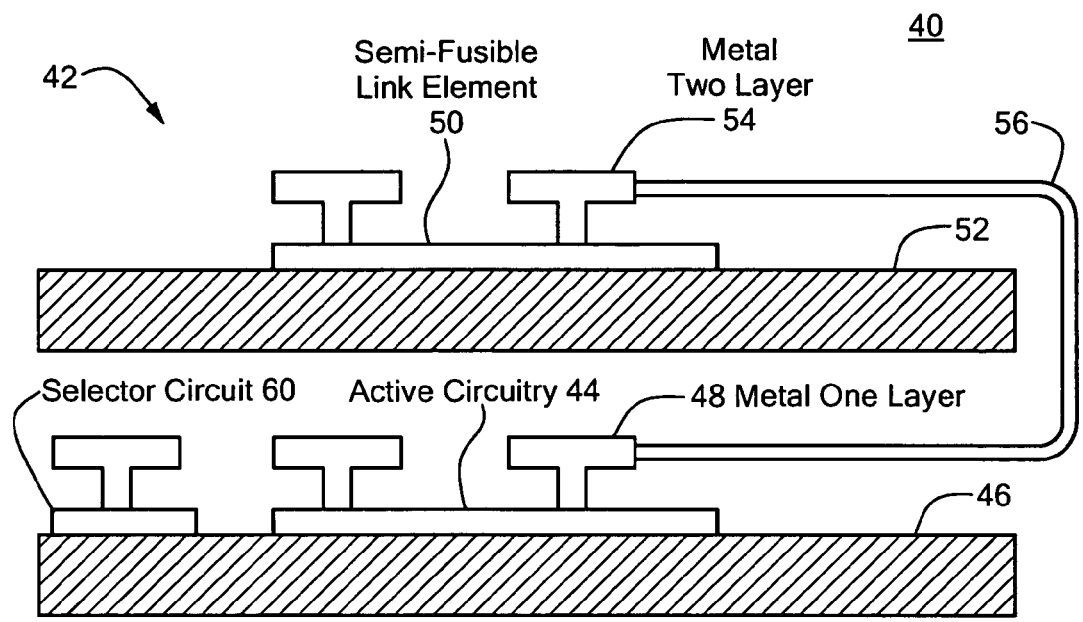
*FIG. 3*
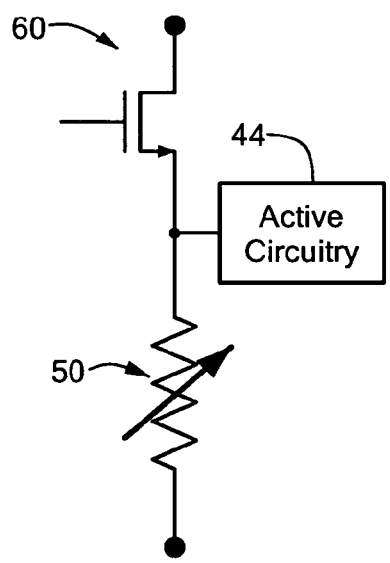 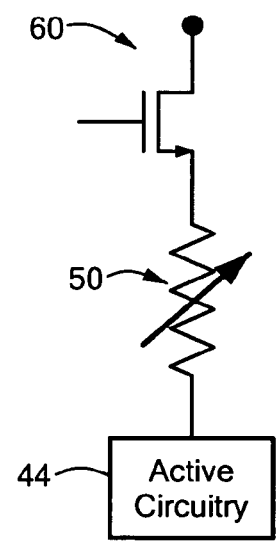
*FIG. 4A*        *FIG. 4B*

SEMI-FUSIBLE LINK SYSTEM FOR A MULTI-LAYER INTEGRATED CIRCUIT AND METHOD OF MAKING SAME

RELATED APPLICATIONS

This application claims benefit of U.S. Provisional Application No. 60/484,369, filed Jul. 2, 2003, entitled "Thin Film Semi-Fusible Links in Sub-Micron Processes".

FIELD OF INVENTION

This invention relates generally to a semi-fusible link system and method and more particularly to such an improved semi-fusible link system and method for a multi-layer integrated circuit.

BACKGROUND OF INVENTION

Fusible links are often employed in an integrated circuit (IC) to trim one or more of the parameters of the IC. A typical fusible link has an intact state and a blown state. In the intact state, the fusible link provides a very low resistance and in the blown state the fusible link provides an open circuit. One example application of a fusible link is trimming the offset voltage of an IC with fusible links connected in series with resistors which are configured such that the resistance between an amplifier's offset input and ground can be adjusted by blowing open the appropriate links.

A typical prior fusible link system includes a large MOS transistor selector circuit which provides a large current to blow the fusible link element. The large transistor of the fusible link wastes value chip space on the IC.

Another type of fusible link which overcomes the problems associated with the large selector circuit is known as a semi-fusible link. The semi-fusible link has a first resistance in the intact state and a second higher resistance in the blown state (which is not an open circuit). A typical prior art semi-fusible link uses a thin film resistor which reduces the amount of current required to blow the fusible link and therefore reduces the amount of space utilized on the IC. An example of a semi-fusible link is disclosed in U.S. Pat. No. 6,246,243, incorporated herein by reference.

The '243 patent typically includes a semi-fusible link element, a select transistor, active circuitry connected to the semi-fusible link element, and an interconnect layer (e.g., metal one layer) to interconnect to a semi-fusible link element to the semi-fusible link system. However, the design of the '243 patent requires both the semi-fusible link and the active circuitry to be connected to the metal one layer which prevents the semi-fusible link element and active circuitry from being disposed over each other. The design also requires the selector circuit to be on the same layer as the fusible link element. The result is that the fuse link element, the active circuitry and the selector circuit must be laterally disposed on the same layer as the metal one layer which wastes valuable chip space.

SUMMARY OF THE INVENTION

It is therefore an object of this invention to provide an improved semi-fusible link system and method.

It is a further object of this invention to provide such a semi-fusible link system and method which reduces the amount of space utilized on an integrated circuit.

It is a further object of this invention to provide such a semi-fusible link system and method which eliminates the need to space the semi-fusible link element and the active circuitry on the same layer.

It is a further object of this invention to provide such a semi-fusible link system and method which eliminates the need to space the semi-fusible link element, the active circuitry and the selector circuit on the same layer.

It is a further object of this invention to provide such a semi-fusible link system and method in which the semi-fusible link element can be on a layer other than the layer on which the active circuitry is located.

It is a further object of this invention to provide such a semi-fusible link system and method in which the selector circuit can be on the same layer as the semi-fusible link element and/or the same layer as the active circuitry.

It is a further object of this invention to provide such a semi-fusible link system in which the semi-fusible link element is located on a layer above or below the layer the active circuitry is located on.

The invention results from the realization that a more compact semi-fusible link can be achieved by providing active circuitry on a first layer which includes a metal one layer, providing a semi-fusible link element on a second layer which includes a metal two layer and interconnecting metal one layer and metal two layer to provide electrical coupling of the semi-fusible link element to the active circuitry and a selector circuit on either the first or second layer to blow the semi-fusible link element thereby effecting a change in a parameter in the active circuitry of an integrated circuit.

This invention features a semi-fusible link system for a multi-layer integrated circuit including active circuitry on a first layer having a metal one layer including a semi-fusible link element on a second layer having a metal two layer adapted for interconnecting with the metal one layer and a selector circuit is disposed on the first layer.

In a preferred embodiment, the semi-fusible link system may include at least one interconnection coupling the metal one layer with the metal two layer for providing an electrical coupling between the semi-fusible link element and the active circuitry. The selector circuit may include an array of semi-fusible link elements on the second layer. The selector circuit may select one of the array of semi-fusible link elements. The selector circuit may include a transistor. The selector circuit may include an NMOS transistor. The semi-fusible link element may include silicon chromium. The second layer may be located above the first layer. The semi-fusible link element may be disposed above the active circuitry. The semi-fusible link element may be disposed above the active circuitry and the selector circuit. The semi-fusible link element may include a thin film resistor. The active circuitry may blow the semi-fusible link element to effect a change in a parameter of the integrated circuit. The selector circuit may blow the semi-fusible link element to effect a change in a parameter of the integrated circuit.

This invention further features a semi-fusible link system for a multi-layer integrated circuit including active circuitry on a first layer having a metal one layer including a semi-fusible link element on a second layer having a metal two layer adapted for interconnecting with said metal one layer, and a selector circuit disposed on said first layer, one of said active circuitry and said selector circuit for blowing said semi-fusible link element to effect a change in a parameter in said integrated circuit.

This invention also features a semi-fusible link system for a multi-layer integrated circuit including active circuitry on a first layer having a metal one layer including a semi-fusible link element on a second layer having a metal two layer adapted for interconnecting with the metal one layer, the second layer being above the first layer, at least one interconnection coupling the metal one layer with the metal two layer for providing an electrical coupling between the semi-fusible link element and the active circuitry, and a selector circuit disposed on the first layer.

This invention also features a semi-fusible link system for a multi-layer integrated circuit including active circuitry on a first layer having a metal one layer, including a thin film resistor semi-fusible link element on a second layer having a metal two layer adapted for interconnecting with the metal one layer, the second layer being above the first layer, at least one interconnection coupling the metal one layer to the metal two layer for providing an electrical coupling between the semi-fusible link element and the active circuitry, and a selector circuit including a select transistor disposed on the first layer for blowing the semi-fusible link element.

This invention further features a method for manufacturing a semi-fusible link system for a multi-layer integrated circuit, the method including the steps of forming active circuitry and a selector in a silicon substrate, depositing a first dielectric layer over the substrate, depositing a metal one layer over the contacts, depositing a second dielectric layer over the metal one layer, forming a semi-fusible link element with a thin film resistor body on the second dielectric layer, depositing a third dielectric layer over the semi-fusible link element, providing contacts in the third dielectric layer, depositing a metal two layer on the third dielectric layer depositing a passivation layer of the third dielectric layer, and providing an interconnection between the metal one layer and the metal two layer.

In one embodiment, method for manufacturing a semi-fusible link system for a multi-layer integrated circuit further includes the step of providing contacts on the first and third dielectric layers.

BRIEF DESCRIPTION OF THE DRAWINGS

Other objects, features and advantages will occur to those skilled in the art from the following description of a preferred embodiment and the accompanying drawings, in which:

FIG. 3 is a schematic cross sectional diagram of the semi-fusible link system for a multi-layer integrated circuit of this invention;

FIGS. 4A and 4B are exemplary circuit diagrams of the semi-fusible link system shown in FIG. 3.

PREFERRED EMBODIMENT

Figure 1:
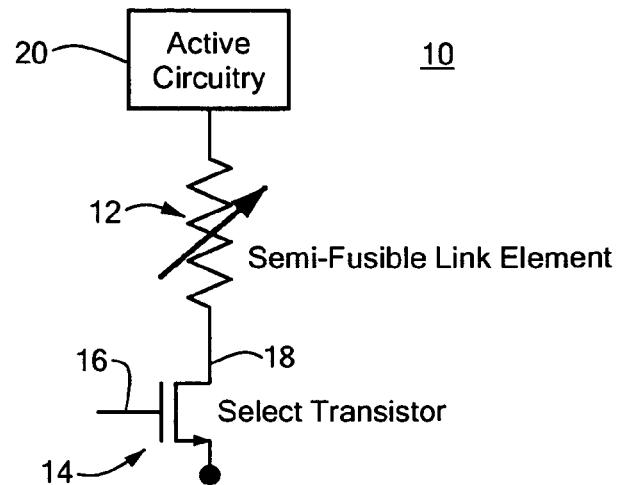
FIG. 1 is a circuit diagram of a typical prior art semi-fusible link system.

Aside from the preferred embodiment or embodiments disclosed below, this invention is capable of other embodiments and of being practiced or being carried out in various ways. This, it is to be understood that the invention is not limited in its application to the details of construction and the arrangements of components set forth in the following description or illustrated in the drawings.

As discussed in the Background section above, prior art semi-fusible link system 10 typically includes a semi-fusible link element 12 and a select transistor 14 (e.g., an NMOS transistor). When semi-fusible link 12 is selected to be blown, a logic high signal at gate 16 activates transistor 14. Current in drain 18 then blows semi-fusible link 12 which causes a change in resistance of semi-fusible link element 12. The change of resistance of semi-fusible link element 12 may be used to effect a change in a parameter of active circuitry 20 coupled to semi-fusible link system 10.

Figure 2:
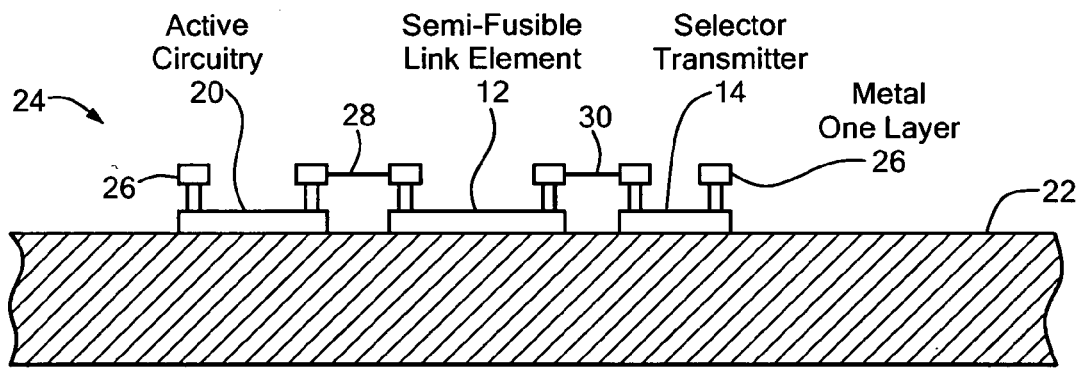
FIG. 2 is a schematic cross-sectional diagram of a prior art semi-fusible link system showing the semi-fusible link device and active circuitry laterally spaced on the IC chip.

As shown in further detail in FIG. 2, the design of prior art system 10 disposes semi-fusible link element 12, select transistor 14 and active circuitry 20 on the same layer 22 of integrated circuit 24. Metal one layer 26 is used to interconnect active circuitry 20 and semi-fusible link element 12 via conductor 28 and to interconnect semi-fusible link 12 to select transistor 14 via conductor 30. The use of metal one layer 26 to interconnect active circuitry 20, semi-fusible link element 12 and selector transistor 14 requires these devices to be laterally spaced on layer 22 of integrated circuit 24.

In contrast, semi-fusible link system 40, FIG. 3 for multi-layer integrated circuit 42 of this invention includes active circuitry 44 disposed on first layer 46. Layer 46 includes metal one layer 48. System 40 also includes semi-fusible link element 50 disposed on second layer 52 having metal two layer 54 which is adapted for interconnecting with metal one layer 48. Although as shown in FIG. 1, layer 52 with semi-fusible link 50 is disposed over layer 46 with active circuitry 44, this is not a necessary limitation of this invention, as layer 46 with active circuitry 44 may be disposed over layer 52 with semi-fusible link element 50. Ideally, semi-fusible link element 50 includes silicon chromium. In a preferred design, semi-fusible link element 50 is a thin film resistor, which is 1.0 μm wide, 0.8 μm length, and a thickness of about 0.005 (50 Å) μm.

Conductor 56 provides an electrical interconnection between metal one layer 48 and metal two layer 54 and enables electrical coupling between semi-fusible link element 50 and active circuitry 44. Hence, semi-fusible link element 50 can be disposed over active circuitry 44 and/or active circuitry 44 can be displaced over fusible link element 50. The result is a significant reduction in the amount of chip space on integrated circuit 42 utilized by semi-fusible link system 40 compared to prior art semi-fusible systems which require the active circuit and fusible link element to be disposed on the same layer.

Selector circuit 60 is typically disposed on first layer 46 an may supply current to blow semi-fusible link element 50. However, any circuit in active circuitry 44 may be used to blow semi-fusible link element 50 and effect a change in a parameter of IC 42. System 40 may also include an array of semi-fusible link elements 50 (not shown) on layer 52 and selector circuit 60 may select an individual semi-fusible link element in the array of semi-fusible link elements. Typically, semi-fusible link 50 is disposed above selector circuit 60 and active circuitry 44. Because semi-fusible link element 50 can be disposed over both active circuitry 44 and selector circuit 60 the need to laterally dispose selector circuit 60, semi-fusible link element 50, and active circuitry 44 all on the same layer as found in the prior art is eliminated. The result is a reduction in the amount of chip space utilized by the semi-fusible link system 40. Selector circuit 60 (e.g., transistor, such as NMOS transistor) may be connected to active circuitry 44 and semi-fusible link element 50 in the configuration shown in FIG. 4A. Alternatively, selector circuit 60 may be coupled to semi-fusible link element 50 and active circuitry 44 as shown in FIG. 4B.

Figure 5A:
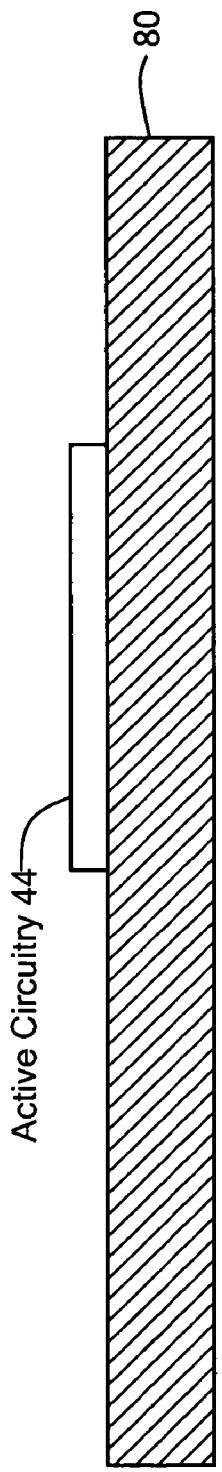
FIGS. 5A–5H are cross-sectional side views showing one example of the steps involved in the method of manufacturing the semi-fusible link system for a multi-layer integrated circuit of this invention.

The method for fabricating semi-fusible link system 40, FIG. 4, of this invention includes the steps of formation of active circuitry 44, FIG. 5A, in the silicon substrate 80.

Figure 5B:
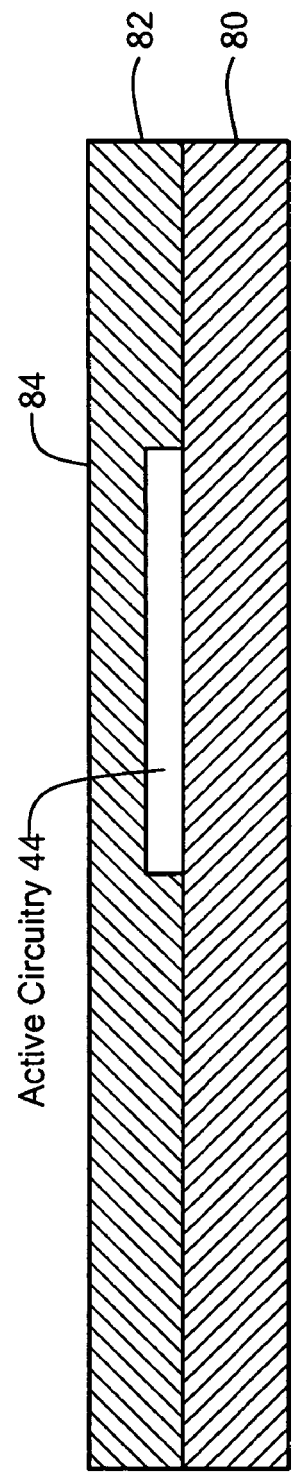

Dielectric layer 82, FIG. 5B, is then deposited over silicon substrate 80. Planarization of layer 82 is performed to flatten surface 84 of dielectric layer 82. Techniques for planarization may include the use of SOG (spin-on-glass), chemical mechanical polishing (CMP) or the application of a highly doped dielectric layer which is then reflowed in a furnace, or any other technique known to those skilled in the art. Dielectric layer 82 is used to electrically isolate the metal one layer from silicon devices.

Figure 5C:
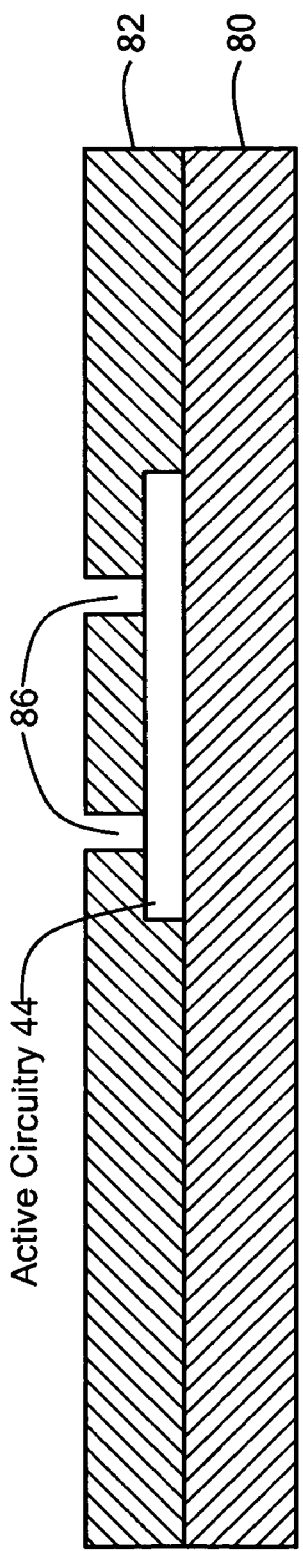
Figure 5D:
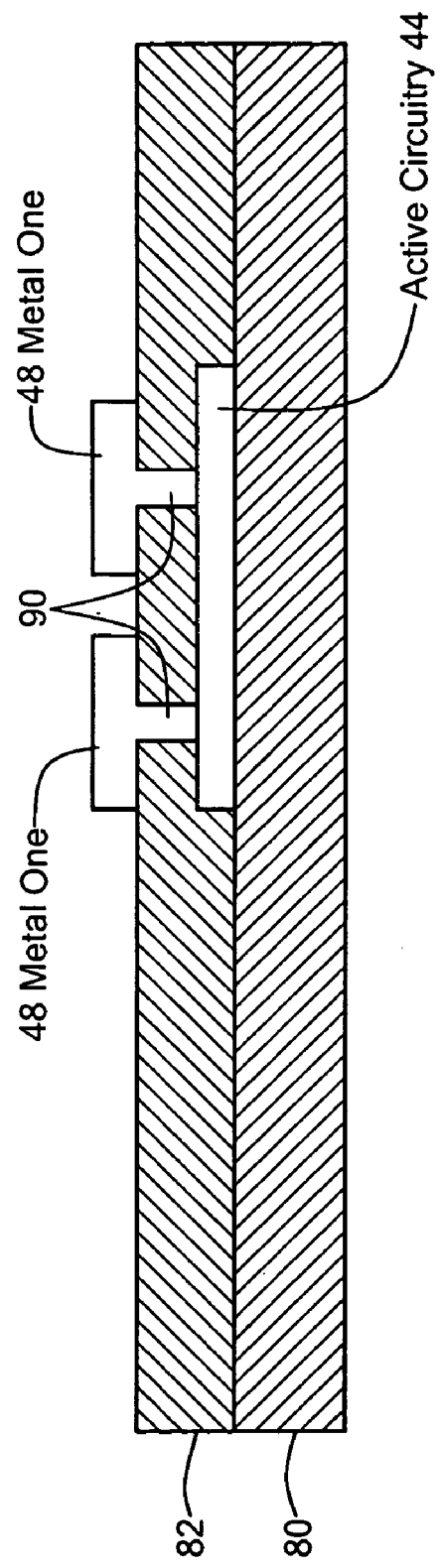
Figure 5E:
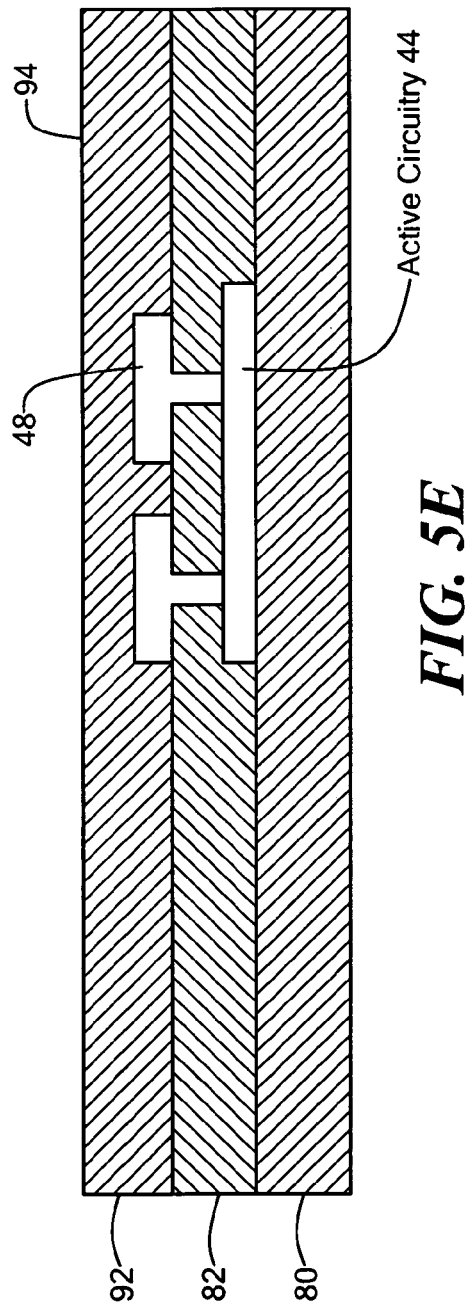

Contact orifices 86, FIG. 5C are then etched in dielectric layer 82. Contacts 90, FIG. 5D, are then made by lining orifices 86 with a barrier/glue metal (e.g., TiW or Ti/Tin) and filling these orifices with tungsten or similar material. Metal one layer 48 is then deposited above contacts 90 and patterned and etched. Metal one layer 48 may include a layer of aluminum-copper (AlCu) and/or a layer of titanium nitride (TiN). Dielectric layer 92, FIG. 5E, is then deposited over metal one layer 44 to isolate metal one layer 44 from the metal two layer. Planarization as described above is performed on surface 94 of dielectric layer 92.

Figure 5F:
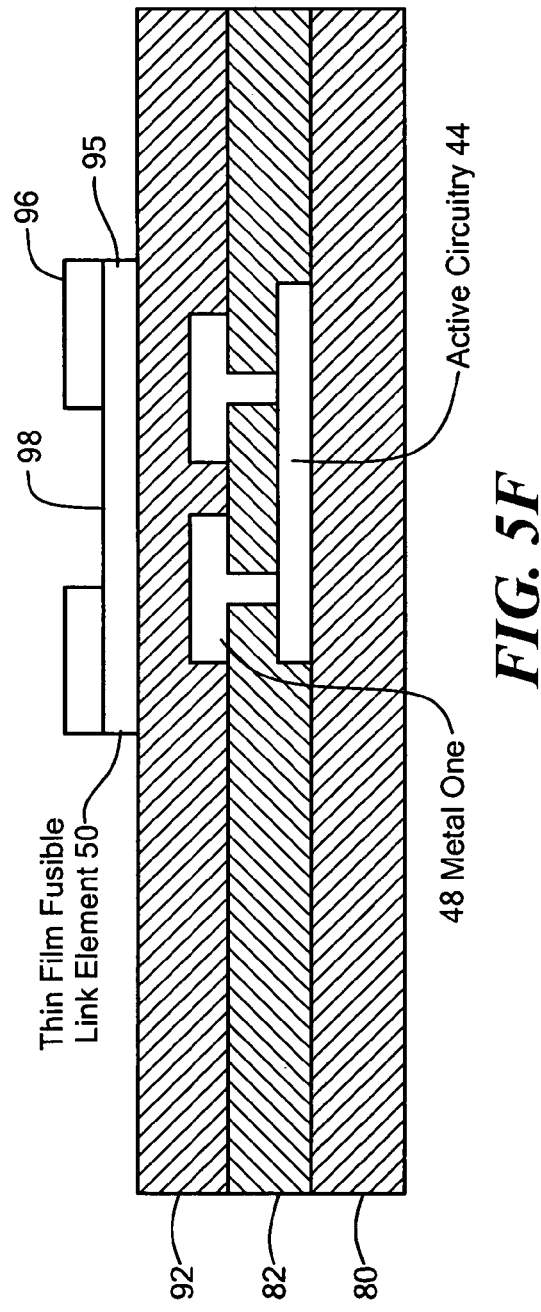

Thin film resistor body 98 for semi-fusible link element 50, FIG. 5F, is formed by first depositing layer 95, ideally composed of SiCr on dielectric layer 92 and then depositing layer 96 composed of titanium-tungsten (TiW) over layer 95. Layers 95 and 96 are masked and etched such that thin film resistor body 98 is formed.

Figure 5G:
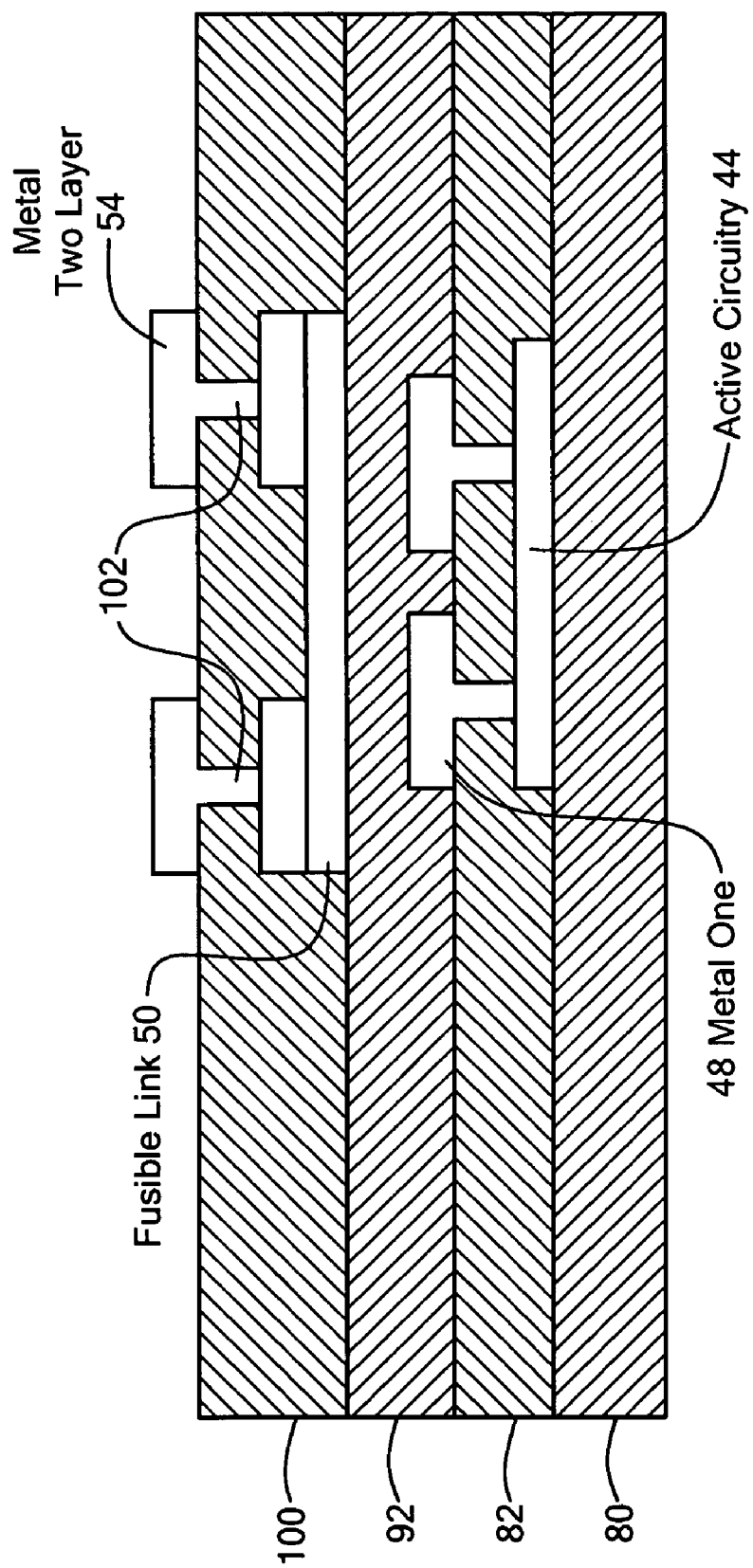

Dielectric layer 100, FIG. 5G, is then deposited over semi-fusible link element 50 and dielectric layer 92. Contacts 102 are made in a similar fashion as the contacts described above. Metal two layer 54 is then deposited over dielectric layer 100.

Figure 5H:
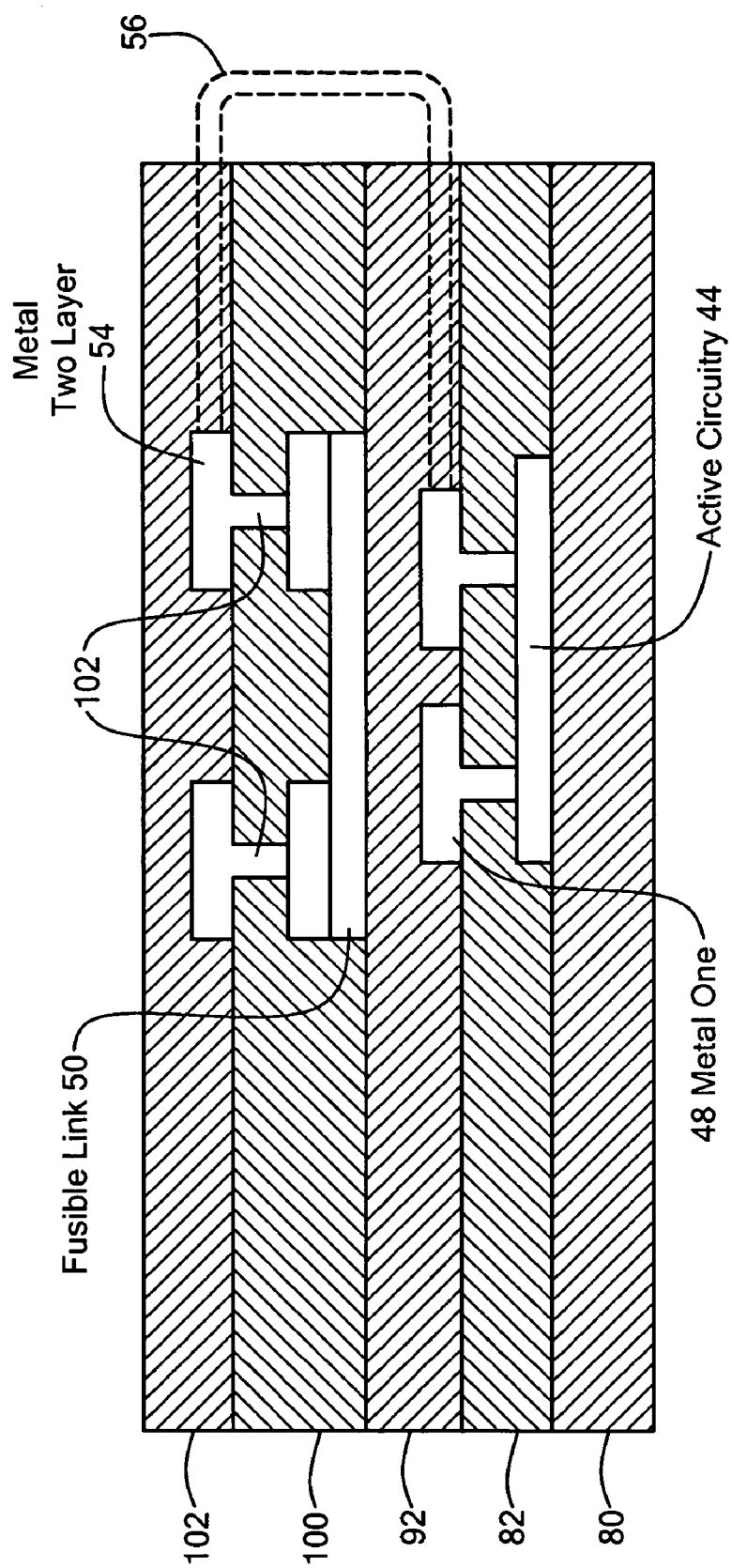

Passivation layer 102, FIG. 5H, is then deposited over layer 100. Passivation layer 102 is ideally a dielectric material and may include silicon oxide and silicon nitride layers (not shown).

Although the process described above is for two layers of metal, the process can be repeated to produce a semi-fusible link system including one or more additional metal layers. Additionally during the manufacturing process, conductor 56 shown in phantom may be integrated into the processing steps to provide for electrical interconnection between metal one layer 48 and metal two layer 54 which enables electrical coupling between semi-fusible link 50 and active circuitry 44. Additionally, or alternatively, semi-fusible link element 50 can be placed between any two metal layers.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

Other embodiments will occur to those skilled in the art and are within the following claims.

What is claimed is:

1. A semi-fusible link system for a multi-layer integrated circuit including active circuitry on a first layer having a metal one layer comprising:
   a semi-fusible link element on a second layer having a metal two layer adapted for interconnecting with said metal one layer; and
   a selector circuit disposed on said first layer.

2. The semi-fusible link system of claim 1 further including at least one interconnection coupling said metal one layer with said metal two layer for providing an electrical coupling between said semi-fusible link element and said active circuitry.

3. The semi-fusible link system of claim 1 further including an array of semi-fusible link elements disposed on said second layer.

4. The semi-fusible link system of claim 1 in which said selector circuit selects one of said array of said semi-fusible link elements.

5. The semi-fusible link system of claim 3 in which said selector circuit includes a transistor.

6. The semi-fusible link system of claim 5 in which said selector circuit includes an NMOS transistor.

7. The semi-fusible link system of claim 1 in which said selector circuit includes an NMOS transistor.

8. The semi-fusible link system of claim 1 in which said semi-fusible link element includes silicon chromium.

9. The semi-fusible link system of claim 1 in which said second layer is located above said first layer.

10. The semi-fusible link system of claim 1 in which said semi-fusible link is disposed above said active circuitry.

11. The semi-fusible link system of claim 1 in which said semi-fusible link is disposed above said active circuitry and said selector circuit.

12. The semi-fusible link system of claim 1 in which said active circuitry blows said semi-fusible link element to effect a change in a parameter of said integrated circuit.

13. The semi-fusible link system of claim 1 in which said selector circuit blows said semi-fusible link element to effect a change in a parameter of said integrated circuit selector circuit.

14. The semi-fusible link system of claim 1 in which said semi-fusible link element includes a thin film resistor.

15. A semi-fusible link system for a multi-layer integrated circuit including active circuitry on a first layer having a metal one layer, comprising:
   a semi-fusible link element on a second layer having a metal two layer adapted for interconnecting with said metal one layer, said second layer being above said first layer;
   at least one interconnection coupling said metal one layer with said metal two layer for providing an electrical coupling between said semi-fusible link element and said active circuitry; and
   a selector circuit disposed on said first layer.

16. The semi-fusible link system of claim 15 in which said selector circuit includes a transistor.

17. The semi-fusible link system of claim 16 in which said selector circuit includes an NMOS transistor.

18. The semi-fusible link system of claim 15 in which said semi-fusible link element includes silicon chromium.

19. The semi-fusible link system of claim 15 in which said semi-fusible link element includes a thin film resistor.

20. The semi-fusible link system of claim 15 in which said semi-fusible link is disposed above said active circuitry.

21. The semi-fusible link system of claim 15 in which said semi-fusible link is disposed above said active circuitry and said selector circuit.

22. The semi-fusible link system of claim 15 in which said active circuitry blows said semi-fusible link element to effect a change in a parameter of said integrated circuit.

23. The semi-fusible link system of claim 15 in which said selector circuit blows said semi-fusible link element to effect a change in a parameter of said integrated circuit selector circuit.

24. A semi-fusible link system for a multi-layer integrated circuit including active circuitry on a first layer having a metal one layer, comprising:
   a thin film resistor semi-fusible link element on a second layer having a metal two layer adapted for interconnecting with said metal one layer, said second layer being above said first layer;

at least one interconnection coupling said metal one layer to said metal two layer for providing an electrical coupling between said semi-fusible link element and said active circuitry; and a selector circuit including a select transistor disposed on said first layer.

25. The semi-fusible link device of claim 24 in which said semi-fusible link element includes silicon chromium.

26. The semi-fusible link system of claim 24 in which said semi-fusible link is disposed above said active circuitry.

27. The semi-fusible link system of claim 24 in which said semi-fusible link is disposed above said active circuitry and said selector circuit.

28. The semi-fusible link system of claim 24 in which said active circuitry blows said semi-fusible link element to effect a change in a parameter of said integrated circuit.

29. The semi-fusible link system of claim 24 in which said selector circuit blows said semi-fusible link element to effect a change in a parameter of said integrated circuit selector circuit.

30. A semi-fusible link system for a multi-layer integrated circuit including active circuitry on a first layer having a metal one layer comprising:

a semi-fusible link element on a second layer having a metal two layer adapted for interconnecting with said metal one layer; and a selector circuit disposed on said first layer, one of said active circuitry and said selector circuit for blowing said semi-fusible link element to effect a change in a parameter in said integrated circuit.

* * * * *